(12) United States Patent
Haas et al.

(10) Patent No.: US 10,132,458 B2
(45) Date of Patent: Nov. 20, 2018

(54) LIGHTING DEVICE HAVING A LIGHTING UNIT

(71) Applicant: OSRAM GmbH, Munich (DE)

(72) Inventors: Norbert Haas, Langenau (DE); Stefan Hadrath, Falkensee (DE)

(73) Assignee: OSRAM GMBH, Munich (DE)

( * ) Notice: Subject to any disclaimer, the term of this patent is extended or adjusted under 35 U.S.C. 154(b) by 0 days.

(21) Appl. No.: 15/736,791

(22) PCT Filed: May 20, 2016

(86) PCT No.: PCT/EP2016/061425
§ 371 (c)(1),
(2) Date: Dec. 15, 2017

(87) PCT Pub. No.: WO2016/202527
PCT Pub. Date: Dec. 22, 2016

(65) Prior Publication Data
US 2018/0180238 A1    Jun. 28, 2018

(30) Foreign Application Priority Data
Jun. 17, 2015  (DE) ........................ 10 2015 007 748

(51) Int. Cl.
*H05B 37/02*  (2006.01)
*H05B 33/08*  (2006.01)
(Continued)

(52) U.S. Cl.
CPC .............. *F21S 41/176* (2018.01); *F21K 9/64* (2016.08); *F21S 41/16* (2018.01); *F21S 41/32* (2018.01);
(Continued)

(58) Field of Classification Search
CPC .......... F21S 41/176; F21S 41/16; F21S 41/32; F21S 41/37; F21K 9/64; F21Y 2115/20;
(Continued)

(56) References Cited

U.S. PATENT DOCUMENTS 4,994,059 A      2/1991  Kosa et al.
2014/0232707 A1  8/2014  Alschinger et al.
(Continued)

FOREIGN PATENT DOCUMENTS

DE    102012201790 A1    8/2013
DE    102012215702 A1    3/2014
(Continued)

OTHER PUBLICATIONS

German Search Report based on application No. 10 2015 007 748.1 (8 pages) dated Apr. 14, 2016 (Reference Purpose Only).
(Continued)

*Primary Examiner* — Jimmy Vu
(74) *Attorney, Agent, or Firm* — Viering, Jentschura & Partner MBB

(57) ABSTRACT

A lighting device provides a lighting unit for emitting useful light and a sensor. The unit includes a laser diode for emitting pump radiation and a phosphor element, which during operation is irradiated by the laser diode and thereby excited and serves for converting the pump radiation into conversion light, which conversion light at least proportionally forms the useful light. The sensor monitors the pump radiation conversion and at the same time detects a conversion light intensity, and is arranged with respect to the phosphor element of the unit so that a portion of the useful light and a measurement portion of the conversion light is incident on the sensor. The lighting device operates so that the phosphor element at least at times is irradiated in a pulsed manner and thereby excited so that between two
(Continued)

pulses the conversion light intensity detected by the sensor decreases by at least 10%.

13 Claims, 3 Drawing Sheets

(51) Int. Cl.
*G02F 1/35* (2006.01)
*F21S 41/176* (2018.01)
*H01S 5/0683* (2006.01)
*F21S 41/32* (2018.01)
*F21S 41/16* (2018.01)
*F21S 41/37* (2018.01)
*F21K 9/64* (2016.01)
*F21Y 115/20* (2016.01)

(52) U.S. Cl.
CPC .......... *F21S 41/37* (2018.01); *H01S 5/06835* (2013.01); *F21Y 2115/20* (2016.08)

(58) Field of Classification Search
CPC ..... H01S 5/06835; H05B 37/02; H05B 33/08; G02F 1/3544; G02F 1/3551; G02F 1/3558; G02F 1/3501; G02F 1/353; G02F 2201/354
USPC ......... 315/151–158, 224–226, 291, 307, 308
See application file for complete search history.

(56) References Cited

U.S. PATENT DOCUMENTS

2016/0010812 A1   1/2016   Kroell et al.
2017/0269455 A1*  9/2017   Kaertner ............... G02F 1/3534

FOREIGN PATENT DOCUMENTS

| DE | 102012220481 A1 | 5/2014 |
| EP | 2297827 A2 | 3/2011 |
| EP | 2829794 A1 | 1/2015 |
| WO | 2010004477 A2 | 1/2010 |
| WO | 2012124607 A1 | 9/2012 |
| WO | 2013029888 A1 | 3/2013 |
| WO | 2014037217 A1 | 3/2014 |
| WO | 2014072226 A1 | 5/2014 |

OTHER PUBLICATIONS

International Search Report based on application No. PCT/EP2016/061425 (12 pages and 3 pages of English translation) dated Sep. 5, 2016 (Reference Purpose Only).

* cited by examiner

LIGHTING DEVICE HAVING A LIGHTING UNIT

RELATED APPLICATIONS

The present application is a national stage entry according to 35 U.S.C. § 371 of PCT application No.: PCT/EP2016/061425 filed on May 20, 2016, which claims priority from German application No.: 10 2015 007 748.1 filed on Jun. 17, 2015, and is incorporated herein by reference in its entirety.

TECHNICAL FIELD

The present disclosure relates to a lighting device including a lighting unit, which includes a laser diode for emitting pump radiation and a phosphor element for converting the pump radiation.

BACKGROUND

With the combination of a laser diode for emitting pump radiation and a phosphor element arranged at a distance therefrom, which phosphor element emits conversion light in response to an excitation with the pump radiation, it is possible to realize light sources having a high luminance. The pump radiation can be e.g. UV radiation or advantageously blue light, which then e.g. proportionally together with the conversion light can form a useful light used for lighting. The conversion light has at least proportions in the visible spectral range.

SUMMARY

The present disclosure addresses the technical problem of specifying a particularly advantageous lighting device.

According to the present disclosure, this problem is solved by a lighting device including a lighting unit for emitting useful light and a sensor, wherein the lighting unit includes a laser diode for emitting pump radiation and a phosphor element, which during operation is irradiated by the laser diode and thereby excited and serves for converting the pump radiation into conversion light, which conversion light at least proportionally forms the useful light, wherein the sensor is provided for monitoring the pump radiation conversion and at the same time is designed to detect a conversion light intensity, and is arranged with respect to the phosphor element of the lighting unit in such a way that a portion of the useful light and thus a measurement portion of the conversion light is incident on the sensor, and wherein the lighting device is configured for operation in such a way that the phosphor element at least at times is irradiated in a pulsed manner and thereby excited in such a way that between two pulses the conversion light intensity detected by the sensor decreases by at least 10%.

Preferred configurations can be found in the dependent claims and throughout the disclosure, wherein a distinction is not always drawn specifically between device and method and/or use aspects in the summary; the disclosure should at any rate be interpreted implicitly with regard to all of the claim categories.

The pump radiation is incident on the phosphor element advantageously in a focused manner, which phosphor element then emits the conversion light generally with a Lambertian emission characteristic (that is to say fanned out). Advantageously, a non-converted portion of the pump radiation together with the conversion light is used as useful light, wherein on account of scattering processes in the phosphor element, for example, that portion of the pump radiation which is then contained in the useful light is also fanned out in a manner comparable to the conversion light. By contrast, in a fault situation, if e.g. the phosphor element falls on account of a defective mechanical fixing, the pump radiation can propagate in a focused manner on the path actually provided for the useful light, which can signify a considerable eye hazard.

With the sensor, therefore, the pump radiation conversion is monitored, and in a fault situation (for example conversion light intensity=0) the laser diode can be switched off for example (see below in detail, also with regard to possible alternatives). By virtue of the fact that the excitation of the phosphor element and thus the conversion light intensity detected by the sensor are now modulated, the metrological detectability is improved. The modulated signal can already be detected better per se, for instance by means of a differential measurement. Moreover, the modulation may e.g. also be advantageous to the effect that the probability of influencing by external extraneous light is at least reduced because the measurement signal has its own characteristic. Even though pulsed operation with the falling conversion light intensity may be disadvantageous e.g. with regard to complexity and the luminous efficiency of the useful light, this is outweighed by the metrological advantage.

The conversion light intensity detected by the sensor is intended to decrease between two pulses by at least 10%, with increasing preference in this order at least 20%, 30%, 40%, 50%, 60% or 70%. In general, a total decrease is also conceivable, but—also owing to the luminous efficiency or a considerable overdimensioning then required for the laser diode—upper limits of the decrease may be e.g. at most 90% or 80%. "Conversion light intensity" is considered to be what is detected by the sensor, that is to say e.g. an average value of the intensity formed by way of the intersection of spectral range of the conversion light and sensitivity range of the sensor. Relative to the total useful light, that portion of the useful light which is incident on the sensor is intended to constitute a rather small portion thereof, e.g. not more than 20%, advantageously not more than 10%, particularly advantageously not more than 5%; such a limitation may be of interest for efficiency reasons, for instance. A lower limit may arise e.g. depending on the sensitivity of the sensor and the total amount of useful light; possible values are e.g. at least 0.1‰, 1‰ or 10‰. The values disclosed for the useful light portion incident on the sensor are intended to be disclosed as preferred for the measurement portion as well (relative to the total conversion light guided away from the phosphor element to the lighting application).

In so far as mention is made of light which is incident "on the sensor", this relates to the light which is incident on the active measurement area of said sensor. The light incident on the measurement area is converted into an electrical signal (given a sensitivity in the corresponding spectral range). The sensor is advantageously a photodiode, wherein a spectral range respectively of interest can then be selected e.g. with a wavelength-dependent filter.

The phosphor element is irradiated in a pulsed manner (at least at times); in this respect, the "pulses" thus arise upon consideration of the pump radiation intensity (taken as an average value over the spectral range of the pump radiation) on the phosphor element over the course of time. The phosphor element is advantageously operated in transmission; in other words, the pump radiation is incident on an incidence surface of the phosphor element and the conversion light is guided away as useful light (advantageously together with a portion of non-converted pump radiation), at an emission surface opposite to said incidence surface.

Alternatively, a reflective arrangement is also possible, in which the phosphor element is mounted e.g. on a reflectively coated substrate, e.g. a cooling element and the pump radiation incident in the phosphor element at an incidence surface penetrates through the phosphor element so as to be reflected at least partly at the reflective coating layer, that is to say then to pass through the phosphor element twice. The incidence surface is simultaneously also the emission surface; the useful light (at least conversion light) is collected from there. Advantageously, in this case, too, the useful light can contain a non-converted portion of the pump radiation and said portion together with the conversion light can then be emitted or scattered in the direction of the pump radiation incidence direction.

The phosphor element advantageously includes a yellow phosphor, particularly advantageously yttrium aluminum garnet (YAG:Ce), as phosphor for emitting yellow light, which is advantageously mixed with a non-converted portion of the blue pump light to form the useful light. The useful light is advantageously white light.

In general, during the operation of the lighting device, the phosphor element can also be permanently irradiated in a pulsed manner by means of pulses having a comparatively long interpulse period, such that between two pulses the conversion light intensity detected by the sensor decreases by at least 10%. However, the phosphor element is irradiated in a pulsed manner with such pulses advantageously only "at times", namely in a specific, first operating state, which advantageously occurs repeatedly over time. In so far as mention is generally made of the fact that the lighting device is configured for specific operation, this means that it is equipped with a control unit, for example, which implements the corresponding functional sequences during the operation of the lighting device.

In one preferred embodiment, in addition to the first operating state, the lighting device is configured for a second operating state, in which the conversion light intensity detected by the sensor is intended to be substantially constant, namely is intended to fall by—with increasing preference in this order—at most 5%, 4%, 3%, 2% or 1% (in comparison with a maximum value which is attained in the respective second operating state). During the operation of the lighting device, that is to say when the latter emits the useful light, the first and second operating states succeed one another alternately.

In this way, it is possible to achieve e.g., on the one hand, a good luminous efficiency (second operating state) in conjunction with, on the other hand, reliably checkable pump radiation conversion (first operating state). The change between the first and second operating states can also constitute a further modulation of the measurement signal per se, e.g. with the abovementioned advantages concerning the metrology.

The time duration for which the lighting device is then respectively in the first or second operating state can generally also vary from change to change. Advantageously, however, the first operating state is present in each case for the same (first) time duration and/or the second operating state is present in each case for the same (second) time duration; particularly advantageously, both hold true, wherein the first and second time durations can indeed differ from one another. The first/second time duration(s) are/is adopted in each case from change to change.

In a preferred configuration, the lighting device is configured for operation in such a way that during a respective first operating state (from the change to through to the change from the first operating state) the conversion light intensity decreases by the at least 10% at least 5 times, advantageously at least 10 times, more advantageously at least 15 times, particularly advantageously at least 20 times (cf. the above disclosure with regard to further values for the percentage decrease).

Generally, the pulses which occur in the first operating state advantageously have the same pulse duration and/or the period duration adopted from rising edge to rising edge in the case of two successive pulses is constant over the first operating state. These values, and also the interpulse period adopted between the falling edge of one pulse and the rising edge of the succeeding pulse are adopted in each case from/through to where the intensity of the respective pulse has risen (rising edge) or fallen (falling edge) to half of its maximum. The pulse duration is thus adopted e.g. as full width at half maximum, and the other variables analogously.

Advantageously, the pulses in the first operating state have in each case a pulse duration of at least 1 ns, more advantageously at least 3 ns, particularly advantageously at least 5 ns; possible upper limits of the pulse duration can be (independently thereof) e.g. at most 50 ns, 40 ns, 30 ns, 20 ns or 10 ns. The interpulse period can e.g. also depend on a relaxation time of the phosphor, which determines how fast the conversion light intensity falls by the desired absolute value. Preference may be given to an interpulse period of at least 10 ns, with increasing preference in this order at least 20 ns, 30 ns, 40 ns, 50 ns, 60 ns or 70 ns; independently thereof, possible upper limits of the interpulse period can be e.g. at most 500 ns, 400 ns, 300 ns, 200 ns, 150 ns or 100 ns.

In the abovementioned second operating state, too, a pulsed excitation is possible (as an alternative to a permanent excitation), wherein the interpulse period is then intended to be e.g. not more than 5 ns, 3 ns or 1 ns (possible lower limits, independently thereof, can be 0.1 ns or 0.5 ns). In the case of a pulsed excitation during the second operating state, the interpulse period in the second operating state is shorter than in the first operating state. The pulse duration in the second operating state can be in the same range as that in the first operating state; reference is made to the values above.

In a preferred configuration, the pulsed irradiation of the phosphor element is achieved by correspondingly pulsed operation of the laser diode, that is to say that the output power thereof is pulsed. "Output power" relates to the power of the pump radiation emitted per se by the laser diode. The modulation is then achieved electronically by means of a corresponding driving, that is to say with a control unit (which is part of the lighting device). Even if generally e.g. a constant output power in conjunction with a shutter or diaphragm wheel for generating the pulses is also conceivable, the pulsed output power can be advantageous in so far as no mechanically moving parts are necessary, which can help to reduce wear and susceptibility to maintenance.

In a preferred configuration, the lighting device is configured for operation in such a way that the output power of the laser diode decreases between the pulses, that is to say in the interpulse period, by at least 30%, with increasing preference in this order at least 40%, 50%, 60%, 70%, 80% or 90%. In this case, the output power is considered to be an average value over time that is formed over the pulse duration of the pulse or the duration of the interpulse period following said pulse. Particularly advantageously, the output power of the laser diode is set to 0 in the interpulse period.

In one preferred embodiment, the lighting device includes a reflector including a reflection surface, via which the useful light is fed to a lighting application. Besides deflection, the reflector advantageously simultaneously serves for shaping, that is to say that the beam shape is adapted, e.g. collimated, by means of the reflector toward e.g. the requirements of the respective lighting application. An aspherical shape, for instance an ellipsoidal, paraboloidal or hyperboloidal shape, may be preferred for the reflection surface. The reflector/reflection surface may also include convex and concave regions or be of freeform design; preference is given to an overall concave shape (concave mirror).

Advantageously, the reflection surface is provided with an interruption, through which the portion of the useful light (with the measurement portion) passes and is incident on the sensor. In terms of its surface area, the interruption is advantageously rather small in relation to a surface area of that part of the reflection surface which is illuminated with useful light. The latter surface area is e.g. in a ratio with respect to the surface area of the interruption of—with increasing preference in this order—at least 10:1, 20:1, 30:1, 40:1 or 50:1; possible upper limits (independently thereof) can be e.g. at most 5000:1, 4000:1, 3000:1, 2000:1, 1000:1, 500:1, 250:1 or 100:1 (with increasing preference in the order as mentioned). The interruption in the reflection surface can have e.g. a surface area of at least 0.5 $mm^2$, 1 $mm^2$, 2 $mm^2$, or 3 $mm^2$, wherein possible upper limits (independently thereof) can be e.g. at most 20 $mm^2$, 15 $mm^2$ or 10 $mm^2$ (in each case with increasing preference in the order as mentioned).

The interruption in the reflection surface is advantageously a continuous hole. The reflection surface can be formed e.g. by a reflective coating applied on the rest of the reflector, for instance a metal film. At any rate said coating is then interrupted and, depending on the constitution of the rest of the reflector, the latter can also be interrupted toward the sensor. The interruption can thus extend through the entire reflector (main body and reflection layer) like a channel toward the sensor.

On the other hand, e.g. a reflector including a transmissive main body can also be provided, in which an interruption of the reflection layer by itself can then also enable the propagation of light toward the sensor. Moreover, the reflector can also be a monolithic part, for instance a metal part, the interior of which is free of material boundaries between different materials or materials having a different production history. In other words, a reflection layer need not necessarily be provided; rather, the monolithic reflector can also itself form the reflection surface, wherein the interruption then extends through the entire reflector.

In general, it is also possible for the useful light portion to be guided inversely with respect to the concept "reflector with interruption", that is to say that a mirror that is small in comparison with the beam cross section can be arranged in a beam path with the useful light, via which mirror the useful light with the measurement portion is coupled onto the sensor (in the case of a plurality of sensors, an array of coupling-out mirrors is possible). In general, even the sensor itself can also be arranged in a beam path with the useful light if the beam cross section is correspondingly large relative to the sensor. In the preferred application in a motor vehicle front headlight, the lighting unit can also already originally emit the useful light in the direction of travel, that is to say that the useful light is then guided with further preference in a reflection-free manner (without reflection) onto the road, e.g. through a lens.

In one preferred embodiment, the useful light portion (with the measurement portion) penetrates through a scattering means, for instance a scattering plate. In this case, the scattering means can be integrated into a reflector just mentioned, that is to say can then be arranged e.g. in the interruption. Alternatively, the scattering means can also be fitted in a manner disposed downstream of the interruption in the beam direction. The scattering means expands the aperture angle of the partial beam with the useful light incident on the sensor, for instance by at least 2.5°, 4° or 5°, wherein possible upper limits (independently thereof) are e.g. at most 30°, 20° or 10° (in each case with increasing preference in the order as mentioned). A $1/e^2$ width or advantageously the full width at half maximum is taken as a basis for determining the change in aperture angle. The scattering means advantageously makes it possible to achieve a homogenization of the conversion light to be measured over the measurement area of the sensor.

The scattering means can be provided as a surface structure and/or as a volume scatterer, advantageously as one thereof. Scattering centers such as e.g. scattering particles and/or gas inclusions can thus be embedded e.g. into a volume material (for instance a scattering plate material). A surface structure provided as scattering means can generally also be geometrically determined, that is to say regular. Preference is given to a matt finish of the surface, which can e.g. also be applied as a coating, but is advantageously achieved by an incipient roughening of a volume material (in particular scattering plate material), for instance in an etching process.

In one preferred embodiment, the useful light proportionally also contains non-converted pump radiation, advantageously blue pump light. A second sensor for detecting the pump radiation intensity is then advantageously provided. The two sensors are then advantageously arranged as close together as possible as a sensor unit, that is to say that the light incident thereon can penetrate e.g. through the same interruption in a reflection surface and/or the same scattering means. Advantageously, the first sensor is a photodiode with a wavelength-dependent filter disposed upstream of the measurement area of said photodiode, said filter allowing the conversion light to pass and blocking the pump radiation (in each case to the extent of at least 60%, 70% or 80%), and/or the second sensor is a photodiode with a wavelength-dependent filter disposed upstream of the measurement area of said photodiode, said filter allowing the pump radiation to pass and blocking the conversion light (in each case to the extent of at least 60%, 70% or 80%). In this case, "blocking" means reflecting and/or absorbing.

By way of example, a polarization filter can also be assigned to the sensor for detecting the pump radiation or the corresponding photodiode, e.g. only light of a specific linear polarization being allowed to pass by said polarization filter. The pump radiation is generally polarized, such that the polarization filter may then thus allow the pump radiation to pass with priority given corresponding tuning (rotational position). If a plurality of lighting units are provided (see below), then e.g. the laser diodes can also be aligned (rotated) differently in each case, such that the respective polarization planes are rotated uniformly. By means of a corresponding adaptation of the orientation of the polarization filters in the case of a plurality of pump radiation sensors, it is thus possible in other words e.g. for a respective sensor to be configured for detecting (with priority) a respective lighting unit.

The combination of two sensors may be advantageous e.g. in so far as with the additional detection of the pump radiation intensity the conversion light intensity can be used not only with absolute limit values for the detection of a fault situation (for example "fallen phosphor element") but also can adopt a relative limit dependent on the pump radiation intensity. If e.g. the output power of the lighting unit is generally reduced, this need not result in a fault situation being ascertained, despite the lower conversion light intensity.

In one preferred embodiment, provision is made of a plurality of sensors for monitoring the pump radiation conversion, which sensors are thus designed in each case for detecting the conversion light intensity. A portion of the useful light and thus a respective measurement portion of the conversion light is then incident on each of the sensors. In this case, "plurality" means at least two, advantageously at least three, particularly advantageously at least four, sensors, wherein possible upper limits (independently thereof) are e.g. at most 20, 15 or 10 sensors. Each of these additional sensors is advantageously configured in accordance with the description of the first conversion light sensor given above and also below.

Particularly advantageously, the plurality of sensors are structurally identical among one another.

The provision of a plurality of sensors for detecting the conversion light intensity is also regarded as a present disclosure independently of the feature "pulsed irradiation" contained in the main claim and is intended also to be disclosed in this form. In this case, however, a combination with the other features is nevertheless possible, that is to say that the sensors can be illuminated e.g. in each case via a respective interruption in the reflection surface and/or by a respective scattering means.

The inventors have established that not only a total failure (fallen phosphor element) can be critical, but e.g. also a local degradation or damage can result in a more than proportional pump radiation entry on the illumination side. This then does not concern the beam with the useful light in its entirety, but rather only an angular range thereof (the spatial distribution on the emission surface of the phosphor element is generally converted into an angular distribution by an optical system, see below). Accordingly, then e.g. with a single sensor positioned e.g. on a center ray of the useful light beam, a "marginal" degradation and thus pump radiation intensity increased critically in an angular range could not be detected or could be detected only to a limited extent. With the plurality of sensors, by contrast, the useful light beam can also be monitored over its angular extent. In other words, e.g. one sensor is arranged rather centrally with respect to the useful light beam (at the center ray) and another sensor is arranged marginally (at the marginal ray).

Advantageously, in the case of the plurality of conversion light sensors, each of the sensors is assigned a respective second sensor for detecting the pump radiation intensity (with the same interruption and/or the same scattering means, see above), that is to say that a plurality of sensor units are provided. In other words, an angularly and also spectrally resolved monitoring of the pump radiation conversion is then possible.

In one preferred embodiment, provision is made of a plurality of lighting units each including a laser diode and a phosphor element and a respective useful light portion from each of the lighting units is incident on the sensor. Advantageously, the lighting device can then be configured for operation in such a way that in the case of a fall in the conversion light intensity detected by the sensor, switching to a test mode is carried out, in which test mode the lighting units are not all switched on simultaneously, but rather are only ever individually switched on in each case successively. In this way, the critical or defective lighting unit can then be individually specified and switched off or dimmed in a targeted manner.

Advantageously, a plurality of the lighting units are also operated in a pulsed manner in each case at least at times in accordance with the first operating state, particularly advantageously all of the lighting units. In this case, if the first operating state advantageously alternates with a second, substantially permanent operating state (see above in detail), the lighting units can also be operated respectively in the first operating state in a manner temporally offset with respect to one another. In a fault situation, this can also help to individually specify the affected lighting unit. It may be preferred for a respectively different time duration of the first operating state and/or a respectively different time duration of the second operating state to be predefined for the different lighting units, which likewise constitutes a possibility for individual assignment.

An individualization may e.g. also be possible in such a way that a respectively different pulse duration and/or a different interpulse period are/is chosen from lighting unit to lighting unit for the first operating state (that is to say in each case a signature). An evaluation unit assigned to the sensor can then individualize the lighting units e.g. according to the frequency (of the pulses) or according to the length thereof. On the other hand, however, the lighting units can generally also be operated in a pulsed manner with synchronization.

It may be preferred for the laser diodes of the lighting units to differ in their respective dominant wavelength, which may also afford a possibility for differentiation. In this case, e.g. a wavelength difference of at least 0.5, advantageously at least 1, more advantageously at least 1.5, may already be of interest metrologically. Lighting units that are correspondingly staggered in terms of their wavelength (of the pump radiation) can be achieved e.g. by sorting the laser diodes whose dominant wavelength may be subject to a certain fluctuation (batch to batch fluctuation) e.g. owing to the dictates of manufacturing.

It is then possible with a plurality of sensors for detecting the pump radiation intensity, for example, to tune each of the sensors to a respective lighting unit, for instance by a respective sensor with its wavelength-dependent filter being adapted to a respective lighting unit (the laser diode thereof), that is to say detecting the pump radiation intensity for the corresponding lighting unit at least with priority (to the extent e.g. of at least 60%, 70% or 80%).

In the case of a pump radiation sensor, too, the modulation resulting from the pulsed irradiation during the first operating state or else resulting from a pulsed irradiation during the second operating state can be used for the individualization of the lighting units in an analogous manner to that described above for the conversion light sensor. Advantageously, by virtue of corresponding differences in the first operating state from lighting unit to lighting unit (in this respect, see above in detail) the lighting units can then be individualized both via the conversion light sensor and via the pump radiation sensor.

Generally, "lighting unit" should advantageously be interpreted as an intrinsically structurally integrated part, that is to say that the laser diode and the phosphor element are combined in a common housing. The latter can be covered toward one side with a transmission window (generally also a lens, advantageously a plane-parallel plate) disposed downstream of the phosphor element, and the opposite side of said transmission window with respect to the phosphor element then forms the emission surface of the lighting unit.

In a preferred configuration, the lighting device is configured at least to reduce a propagation of the pump radiation in a fault situation, such that in other words e.g. the pump radiation intensity decreases at least by 60%, 70%, 80% or 90% (with increasing preference in the order as mentioned). Advantageously, for this purpose, the output power of the laser diode is at least dimmed or completely switched off, wherein the former may be of interest for instance in so far as a certain emergency light function is then maintained. In the preferred case of automotive lighting, this may also be relevant to traffic safety. An electronic shutdown of the laser diode is thus preferred.

In general, however, the propagation of pump radiation can e.g. also be reduced or completely blocked in an optical manner by the introduction of a filter/diaphragm/cover. It is e.g. also possible for an aerosol to be released in the fault situation, for instance in the housing of the lighting unit, in order at least to reduce the propagation of pump radiation. It is also possible, in a manner comparable to an airbag, for a body to expand and reduce the propagation of pump radiation, wherein emergency operation as mentioned above may also remain possible in the case where the body exhibits a certain transparency. By way of example, a foam material can expand in this form; advantageously, a bag that is then filled with a gas in a fault situation and is composed of a material that is transmissive at most in a restrictive manner can actually be provided.

In the preferred application of automotive lighting, the "fault situation" can e.g. also be ascertained depending on a feature of the overall state of the vehicle, wherein e.g. the data from acceleration sensors can be included. A shutdown or dimming can thus take place e.g. hand in hand with commencement of the seatbelt pretensioner actually before an accident. However, a coupling to e.g. the airbag trigger is also possible.

In one preferred embodiment, the lighting device is configured to ascertain the fault situation depending on a decrease in the conversion light intensity detected by the sensor. In this regard, it is possible precisely to deduce e.g. a fallen or locally degraded phosphor element and accordingly the risk of the more than proportional emergence of highly energetic/focused pump radiation. In this case, the detection of the fault situation can additionally also be linked to a further criterion, such that in other words e.g. the fault situation is ascertained merely if it can be ruled out that the decrease is caused by a generally reduced output power of the lighting unit. Advantageously, the decrease in the conversion light intensity is considered together with and depending on the behavior of the pump radiation intensity.

The present disclosure also relates to a motor vehicle headlight including a lighting device disclosed in the present case, advantageously a front headlight.

As already mentioned in the introduction, the present disclosure also relates to the use of a lighting device disclosed in the present case for lighting, advantageously for motor vehicle lighting, more advantageously for motor vehicle exterior lighting, particularly advantageously in a front headlight. However, an application e.g. also in the case of the rear luminaires/signal luminaires, in particular the brake luminaires may be of interest. An application in a vehicle interior is also conceivable.

Preference is given to a use of the lighting device for which the latter is configured. In other words, in so far as method features are specified in the present disclosure, they should be interpreted, on the one hand, to the effect that the lighting device, by means of a corresponding control unit, is configured for carrying out the respective method steps, that is to say that the latter proceed in an automated manner during the operation of the lighting device. On the other hand, the disclosure should precisely also be interpreted as directed to a corresponding use of the lighting device, in the course of which use the method steps are carried out.

BRIEF DESCRIPTION OF THE DRAWINGS

The invention is explained in greater detail below on the basis of embodiments, wherein the individual features in the context of the alternative independent claims may also be essential to the invention in some other combination and moreover a distinction is still not drawn specifically between the different claim categories.

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1A:
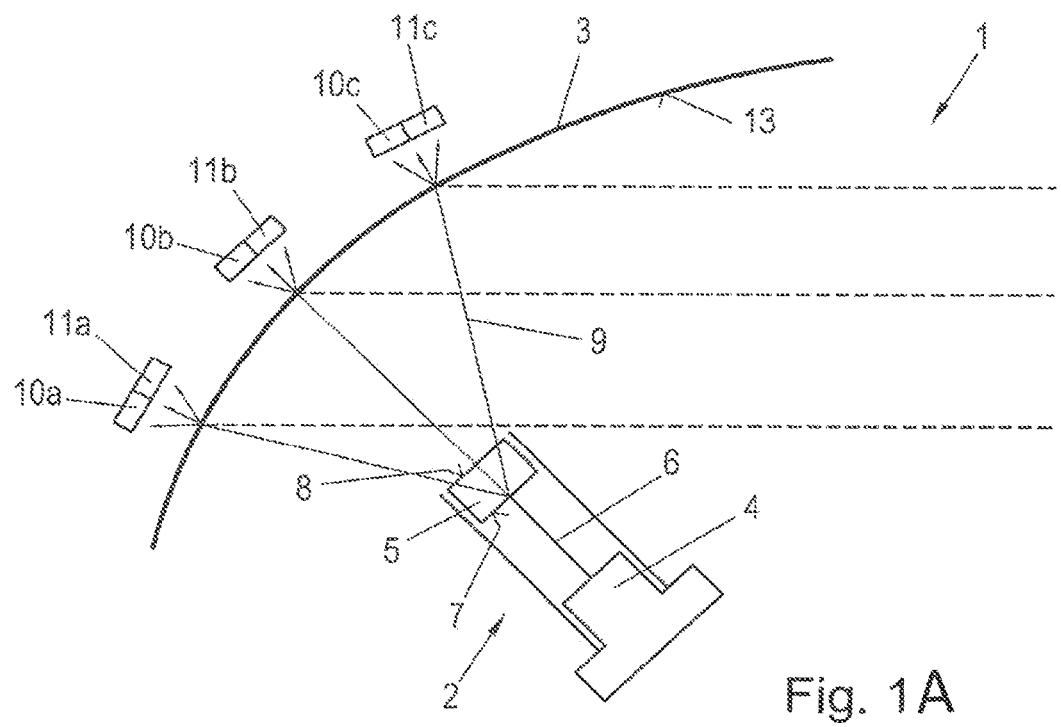
FIG. 1A shows a lighting device according to the present disclosure in a schematic, partly sectional side view.

FIG. 1A shows a lighting device 1 according to the present disclosure including a lighting unit 2 and a reflector 3. The lighting unit 2, shown schematically in sectional view, is constructed from a laser diode 4 and a phosphor element 5. A pump radiation 6 emitted by the laser diode 4 is incident on an incidence surface 7 of the phosphor element 5 and in the latter is partly converted into yellow conversion light (the phosphor element 5 includes YAG:Ce).

At an emission surface 8 opposite to the incidence surface 7, useful light 9 is emitted in approximately Lambertian form. Said useful light 9 is composed of the conversion light and a non-converted portion of the pump radiation 6, which is blue pump light in the present case. The useful light 9 is white light, which is fed via the reflector 3 (after a reflection at the reflection surface 13 thereof) to a lighting application, namely is used for illuminating the road.

Three sensor units 10, 11 are arranged on that side of the reflector 3 which faces away from the lighting unit 2, each of said sensor units being composed of a sensor 10 for detecting the conversion light intensity and a sensor 11 for detecting the pump radiation intensity. Each sensor 10, 11 corresponds to a photodiode with a wavelength-dependent filter (not illustrated) disposed upstream, which allows the light in the corresponding wavelength range to pass to the respective photodiode. The conversion light passes to the photodiodes of the sensors 10 and the pump radiation passes to those of the sensors 11 (the respective other portion of the useful light 9 is blocked).

Figure 1B:
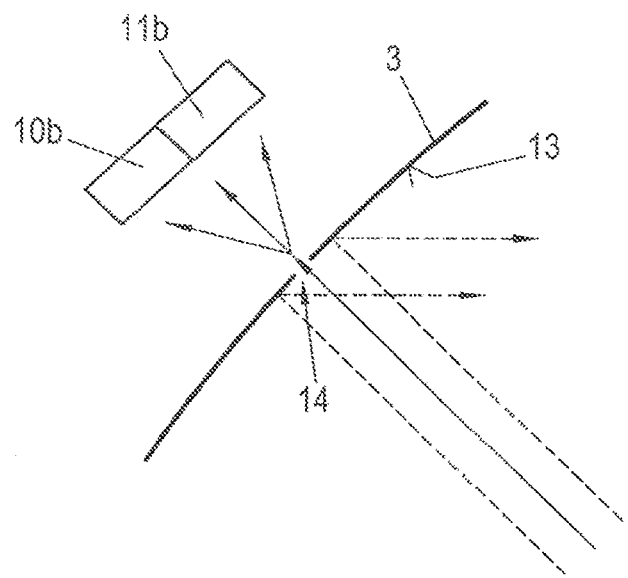
FIG. 1B shows a detail view with respect to FIG. 1A.

In order to guide the useful light 9 to a respective sensor unit 10, 11, as illustrated in FIG. 1B the reflection surface 13 is provided with interruptions 14, through which useful light 9 is incident locally in each case on the respective sensor unit 10, 11. The interruptions 14 are comparatively small with an area of in each case around 0.5 mm$^2$, that is to say that, per sensor unit 10, 11, only a comparatively small portion of the useful light 9 is lost for the measurement. The light fed to the lighting application is represented by dashed lines.

In the present case, the reflector 13 is provided as a metal part, the surface of which forms the reflection surface 13. In the region of the respective interruption 14, the reflector 13 is interrupted in its entirety. A respective scattering plate (not illustrated for the sake of clarity) is inserted into each interruption 14, said scattering plate expanding the useful light respectively passing through the interruption 14 and thus homogenizing said useful light over the respective sensor unit 10, 11.

The phosphor element 5 is excited in a pulsed manner in a first operating state, such that the laser diode 4 emits pump radiation in pulses with a comparatively long interpulse period in relation to the pulse duration. Consequently, the conversion light intensity detected by a respective conversion light sensor 10 is not constant, but rather falls in accordance with the relaxation time of the phosphor; cf. FIG. 2A for illustration.

Figure 2A:
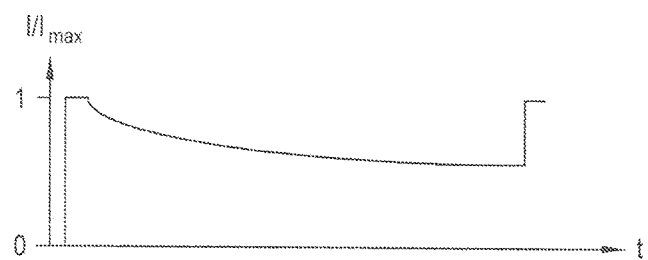
FIG. 2A shows the conversion light intensity detected by one of the sensors in a first operating state in the case of the lighting device in accordance with FIG. 1 over the course of time.

Per conversion light sensor 10, a modulated signal is then available at times with the correspondingly fluctuating conversion light intensity, which modulated signal is metrologically reliably accessible. FIG. 2A shows the conversion light intensity on one of the conversion light sensors 10 over the course of time and illustrates in particular the fall during the interpulse period (between two pulses).

Figure 2B:
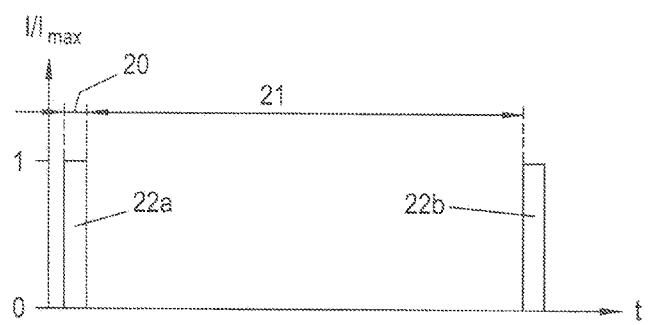
FIG. 2B shows the pump radiation intensity in the first operating state in accordance with FIG. 2A over the course of time.

FIG. 2B correspondingly shows the temporal profile of the pump radiation intensity, which is detected by one of the pump radiation sensors 11 in the present case. If the pump radiation intensity on the incidence surface 7 of the phosphor element 5 were evaluated, qualitatively the same profile would result. The pulse duration 20 is comparatively short in comparison with the interpulse period 21, with the former being approximately 5 ns and the latter being approximately 80 ns. By virtue of the fact that the pulses 22 succeed one another with a corresponding spacing, that is to say that excitation is effected "slowly" in a pulsed manner, the relaxation of the phosphor becomes visible and the fluctuating conversion light intensity results (FIG. 2A).

However, the lighting device 1 is not permanently operated in said first operating state, also because this would result in only a very low pump radiation yield on average and would accordingly require a considerably overdimensioned laser diode 4.

Figure 3A:
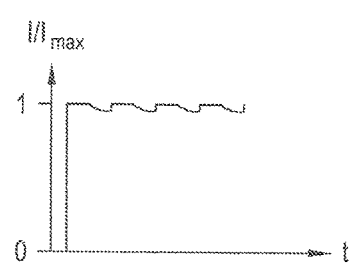
FIG. 3A shows the conversion light intensity detected by one of the sensors of the lighting device in accordance with FIG. 1 in a second operating state.
Figure 3B:
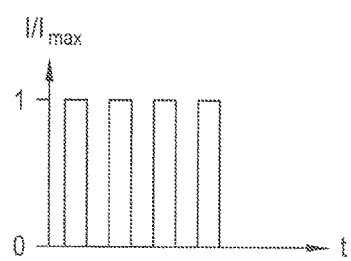
FIG. 3B shows the pump radiation intensity for generating the conversion light intensity in accordance with FIG. 3A.

FIGS. 3A and B accordingly show a second "permanent" operating state, which is present alternately with the first operating state during the operation of the lighting device. The conversion light intensity fluctuates only marginally in the second operating state (cf. FIG. 3A for illustration), even though excitation is effected in a pulsed manner in this case, too. The pulse duration with a value of 5 ns also corresponds to that in the first operating state, but the interpulse period with a value of 5 ns is considerably shorter. The pulses thus succeed one another more rapidly (cf. FIG. 3B for illustration). Accordingly, the phosphor scarcely relaxes in the respective interpulse periods, that is to say that the conversion light intensity almost does not decrease.

The alternation between first and second operating states is already advantageous overall on account of the pump radiation yield, that is to say that it is possible to achieve a good efficiency, on the one hand, and the stated metrological advantages, on the other hand. Moreover, the switching back and forth between first and second operating states also produces a modulation that can be used metrologically.

If e.g. the phosphor element 5 of the lighting unit 2 then falls, for instance on account of a mechanical fatigue of the fixing, the conversion light sensors 10 detect a reduction of the conversion light intensity, that is to say that in particular the modulated signal is no longer ascertained. In a comparison with the data determined via the pump radiation sensors 11, for example, it is then possible to ensure that the reduction of the conversion light intensity is not generally due to a reduced output power of the lighting unit 2. In this regard, the fault situation "fallen phosphor element" can be reliably ascertained, whereupon the power supply of the laser diode 4 is then interrupted. In this way, the propagation of the pump radiation 6 is interrupted and pump radiation having a high power density can be prevented from emerging unimpeded (on account of the fallen phosphor element).

A plurality of sensor units 10, 11 are provided in the case of the lighting device 1 in accordance with FIG. 1 because the inventors have established that not only a fallen phosphor element 5 can be problematic as total failure, but also a local degradation of the phosphor element 5 can already result in a dangerous emergence of pump radiation. In such a fault situation, the pump radiation intensity incident on one of the pump radiation sensors 11 may be boosted, for instance on account of a damage-induced excessive deflection (e.g. by reflections at defective sites) of the pump radiation in one direction.

In general, an optical system will be arranged between the lighting unit 2 and the reflector 3, said optical system converting a spatial distribution on the emission surface 8 of the phosphor element 5 into an angular distribution. Accordingly, therefore, light emitted at different locations of the emission surface 8 is directed in different directions and accordingly onto a different sensor unit 10, 11 in each case. By means of monitoring an angular range with the sensor units 10, 11, it is thus possible in this respect, at least to a certain approximation, to detect the emission surface 8 over the area thereof. With just a single sensor unit 10, 11, there may be a greater probability of this sensor unit being "blind" to part of the emission surface 8, with the result, therefore, that not every conceivable fault situation can be reliably detected.

Figure 4:
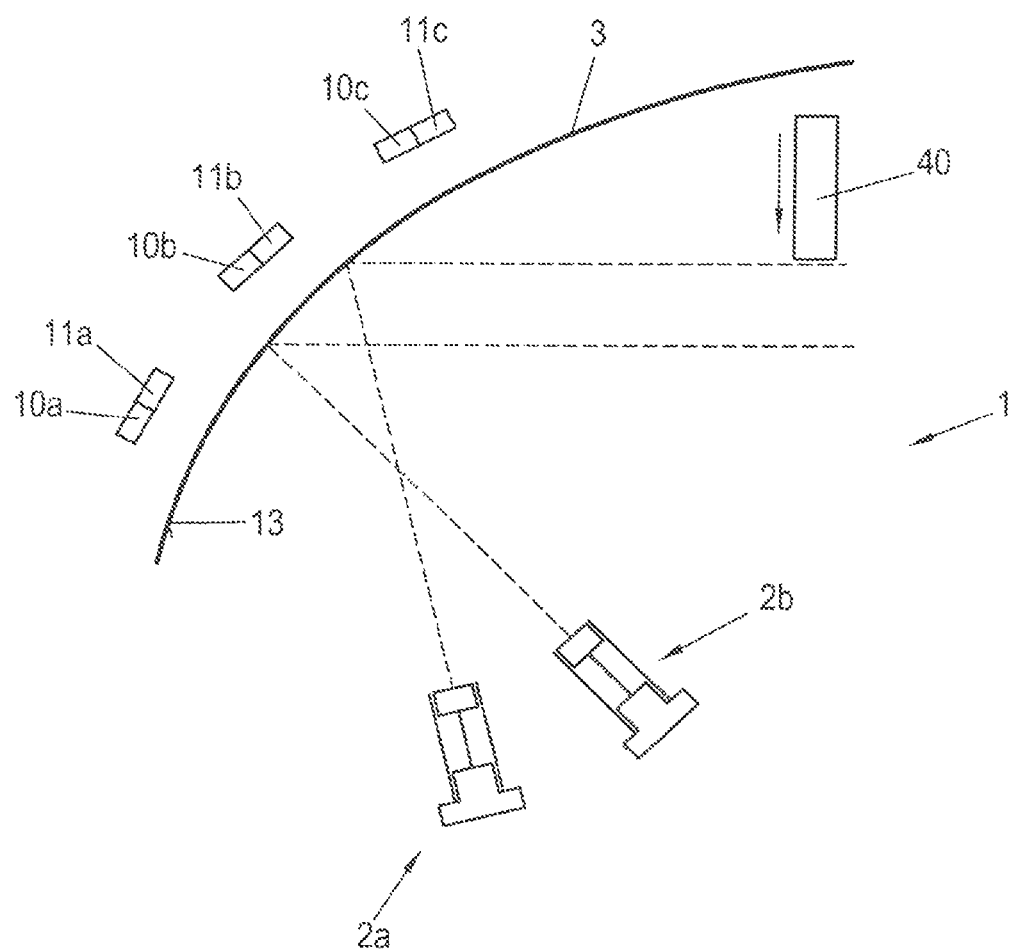
FIG. 4 shows a further lighting device according to the present disclosure including two lighting units.

FIG. 4 shows a further lighting device 1 according to the present disclosure, which corresponds to that in accordance with FIG. 1 in terms of its fundamental construction. Generally, in the context of this disclosure, the same reference signs refer to parts having the same function and reference is then always also made to the corresponding description concerning the other figures. In contrast to the lighting device 1 in accordance with FIG. 1, in the case of the lighting device in accordance with FIG. 4, two lighting units 2a, 2b are provided, which are constructed in each case as explained with reference to FIG. 1.

The lighting units 2a, 2b are inherently also operated in each case alternately in a first (slow) and a second (permanent) operating state. In this case, however, from lighting unit 2a to lighting unit 2b the first operating state occurs in a temporally offset manner, as a result of which the fluctuation of the conversion light and/or pump radiation intensity that is detected at a respective point in time can be unambiguously assigned to one of the two lighting units 2a, 2b.

Accordingly, a fault situation can then be unambiguously assigned to one of the two lighting units 2a, 2b if said fault situation is ascertained in the time interval in which said lighting unit 2a, 2b is in the first operating state. The lighting unit 2a, 2b can then be switched off in a targeted manner.

As an alternative to the electronic shutdown, FIG. 4 shows a further possibility as to how the propagation of the pump radiation can be interrupted in the fault situation. To that end, a shutter 40 is provided, which is moved into the path of the beam in the fault situation (indicated by the arrow). As an alternative to such a shutter, by way of example, the injection of an aerosol would also be possible or a type of mini-airbag could be triggered and interrupt the propagation of the pump radiation.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A lighting device comprising
a lighting unit for emitting useful light and a sensor, wherein the lighting unit
comprises a laser diode for emitting pump radiation and a phosphor element, which during operation is irradiated by the laser diode and thereby excited and serves for converting the pump radiation into conversion light, which conversion light at least proportionally forms the useful light,
wherein the sensor is provided for monitoring the pump radiation conversion and at the same time is designed to detect a conversion light intensity, and is arranged with respect to the phosphor element of the lighting unit in such a way that a portion of the useful light and thus a measurement portion of the conversion light is incident on the sensor, and wherein the lighting device is configured for operation in such a way that the phosphor element at least at times is irradiated in a pulsed manner and thereby excited in such a way that between two pulses the conversion light intensity detected by the sensor decreases by at least 10%.

2. The lighting device as claimed in claim 1, which is configured for operation in such a way that the pulsed excitation of the phosphor element is carried out in a first operating state and, in a second operating state, the phosphor element is irradiated and thereby excited in such a way that the conversion light intensity detected by the sensor falls by at most 5% relative to a maximum value attained during the second operating state, wherein the first and second operating states succeed one another alternately during the operation of the lighting device.

3. The lighting device as claimed in claim 2, which is configured for operation in such a way that in each case when the lighting device is operated in the first operating state, the conversion light intensity detected by the sensor decreases by at least 10% at least five times.

4. The lighting device as claimed in claim 1, wherein, for the pulsed irradiation of the phosphor element, the laser diode is operated with a pulsed output power.

5. The lighting device as claimed in claim 4, which is configured for operation in such a way that the output power of the laser diode is reduced between the pulses by at least 30% relative to the output power during the respectively preceding pulse.

6. The lighting device as claimed in claim 1 further comprising a reflector comprising a reflection surface, via which the useful light is guided to a lighting application, wherein the reflection surface is provided with an interruption, through which that portion of the useful light which is incident on the sensor passes.

7. The lighting device as claimed in claim 1, wherein a scattering means is assigned to the sensor, through which scattering means penetrates that part of the useful light which is then incident on the sensor.

8. The lighting device as claimed in claim 1, wherein the useful light proportionally also contains non-converted pump radiation and a second sensor is designed to detect an intensity of a pump radiation incident thereon.

9. The lighting device as claimed in claim 1 further comprising a plurality of sensors for monitoring the conversion of the pump radiation, wherein a respective portion of the useful light is incident on each of the sensors.

10. The lighting device as claimed in claim 1, further comprising a plurality of lighting units each designed for emitting useful light, wherein in each case a portion of the useful light emitted by a respective one of the lighting units is incident on the sensor.

11. The lighting device as claimed in claim 1, which is configured at least to reduce a propagation of the pump radiation in a fault situation.

12. The lighting device as claimed in claim 11, which is configured to ascertain the fault situation depending on a decrease in the conversion light intensity detected by the sensor.

13. The lighting device as claimed in claim 12, further comprising a plurality of lighting units each designed for emitting useful light, wherein in each case a portion of the useful light emitted by a respective one of the lighting units is incident on the sensor, wherein the lighting device is configured to individually specify in the fault situation which of the lighting units is affected.

* * * * *